United States Patent
Kong et al.

(10) Patent No.: US 7,447,067 B2
(45) Date of Patent: Nov. 4, 2008

(54) METHOD AND APPARATUS FOR PROGRAMMING MULTI LEVEL CELL FLASH MEMORY DEVICE

(75) Inventors: Jae-Phil Kong, Hawseong-si (KR); Jae-Yong Jeong, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 277 days.

(21) Appl. No.: 11/453,991

(22) Filed: Jun. 16, 2006

(65) Prior Publication Data

US 2007/0035994 A1    Feb. 15, 2007

(30) Foreign Application Priority Data

Jul. 29, 2005   (KR) ................ 10-2005-0069566

(51) Int. Cl.
*G11C 11/34* (2006.01)
(52) U.S. Cl. .............. 365/185.03; 365/185.18; 365/185.22; 365/185.23
(58) Field of Classification Search ............ 365/185.03, 365/185.18, 185.22, 185.23
See application file for complete search history.

(56) References Cited

U.S. PATENT DOCUMENTS

| | | | |
|---|---|---|---|
| 5,943,260 A | 8/1999 | Hirakawa | |
| 6,363,010 B2* | 3/2002 | Tanaka et al. | 365/185.03 |
| 6,426,892 B2 | 7/2002 | Shibata et al. | |
| 6,836,431 B2 | 12/2004 | Chang | |
| 7,082,056 B2* | 7/2006 | Chen et al. | 365/185.03 |
| 7,224,614 B1* | 5/2007 | Chan | 365/185.18 |
| 7,251,160 B2* | 7/2007 | Li et al. | 365/185.03 |
| 7,310,255 B2* | 12/2007 | Chan | 365/185.03 |

FOREIGN PATENT DOCUMENTS

| | | |
|---|---|---|
| JP | 10-241380 | 9/1998 |
| JP | 2001-093288 | 4/2001 |
| JP | 2003-022683 | 1/2003 |
| KR | 1020010070086 | 7/2001 |
| KR | 10-0313557 | 2/2002 |
| KR | 1020030002730 | 1/2003 |
| KR | 1020060052627 A | 5/2006 |

* cited by examiner

*Primary Examiner*—Tuan T. Nguyen
(74) *Attorney, Agent, or Firm*—Volentine & Whitt, PLLC

(57) ABSTRACT

A method of programming a selected cell in a multi-level flash memory device comprises determining whether to program an upper bit or a lower bit of a selected memory cell, detecting a current logic state of two bits of data stored in the selected memory cell, determining a target logic state for the upper or lower bit, generating a program voltage and a verify voltage for programming the upper or lower bit to the target logic state, and applying the program voltage and the verify voltage to a word line connected to the selected memory cell.

18 Claims, 4 Drawing Sheets

LSB → MSB Program Sequence

MSB → LSB Program Sequence

LSB → MSB Program Sequence

MSB → LSB Program Sequence

LSB → MSB Program Sequence

MSB → LSB Program Sequence

METHOD AND APPARATUS FOR PROGRAMMING MULTI LEVEL CELL FLASH MEMORY DEVICE

BACKGROUND OF THE INVENTION

1. Field of the Invention

Embodiments of the present invention relate generally to a semiconductor memory device. More particularly, embodiments of the invention relate to a method and apparatus for programming a flash memory device having multi-level cells.

A claim of priority is made to Korean Patent Application No. 2005-69566, filed Jul. 29, 2005, the subject matter of which is hereby incorporated by reference in its entirety.

2. Description of the Related Art

A flash memory device is a nonvolatile memory device capable of being electrically programmed and erased. Flash memory devices have become increasingly popular in recent years as the demand for high capacity and high-speed nonvolatile memories has continued to increase in application areas such as portable electronic devices and code memories.

Flash memory can be broadly classified into NAND type flash memory and NOR type flash memory. NOR type flash memory has a structure wherein a plurality of memory cells are connected in parallel to a bit line, and NAND type flash memory has a structure wherein a plurality of memory cells are connected in series to a bit line. Because the memory cells in NOR type flash memory are connected to bit lines in parallel, NOR type flash memory allows random access to stored data. In contrast, NAND type flash memory only allows sequential access to data. As a result of their different cell arrangements, NOR type flash memory tends to provide faster read times than NAND type flash memory, and therefore NOR type flash memory is often used in applications requiring high read speed such as the storage of program code. On the other hand, NAND type flash memory tends to have higher integration density and higher program and erase speeds than NOR type flash memory, and therefore it is often used for applications such as long term data storage.

In an effort to improve the integration density of both NOR and NAND type flash memory devices, researchers have developed flash memory devices having memory cells capable of storing more than one bit of information. These memory cells are commonly referred to as "multi level cells" (MLC) and devices containing MLCs are referred to as MLC devices. The operation of a conventional MLC flash memory device is described below with reference to FIGS. 1 and 2.

FIG. 1 is a drawing illustrating a threshold voltage distribution for a MLC capable of storing two bits of information, i.e., a most significant bit (MSB) and a least significant bit (LSB). Referring to FIG. 1, the MLC can store the data values '11', '10', '00', and '01', by adjusting the threshold voltage of the cell in ascending order. For example, where the MLC has a first threshold voltage, the MLC stores the data value '11.' Where the MLC has a second, higher threshold voltage, the MLC stores the data value '10,' and so on. In general, the data value '11' corresponds to an erased state of the MLC, and programming of the MLC begins from the erased state.

FIG. 2A is a state transition diagram illustrating a sequence for programming data into the MLC. In FIGS. 2A and 2B, states are labeled '11', '10', '00', and '01' to correspond to states of the MLC when it stores these respective data values. These states can also be referred to as state '11', state '10' and so on. According to the state transition diagram shown in FIG. 2A, the MLC is programmed by first programming its LSB, and then programming its MSB.

A transition of the MLC from state '11' to state '10' by changing its LSB is executed through a path denoted ① in FIG. 2A. A transition of the MLC from state '11' to state '01' by changing its MSB is performed along a path denoted ③ in FIG. 2A. A transition of the MLC from state '11' to state '00' by changing both its LSB and its MSB is executed along paths denoted ① and ② in FIG. 2A. Paths ②, and ③ correspond to program procedures which are performed to program the MSB after programming the LSB. Where the LSB is programmed first and the MSB is programmed second, it is assured from the state transition diagram of FIG. 2 that the program is performed favorably.

FIG. 2B is a state transition diagram illustrating why the LSB cannot be programmed after the MSB is programmed, where the threshold voltages corresponding to the logic states of the MLC are arranged as shown in FIG. 1. First, consider a program operation wherein the MLC is programmed from state '11' to state '00'. The program operation should first change the MLC from state '11' to state '01' through a path ④ where the MSB is converted from '1' into '0'. Next, the program operation should change the MLC from state '01' to state '00' through a path ⑤ where the LSB is converted from '1' to 0'. Unfortunately, however, a MLC with the threshold voltage distributions and corresponding states shown in FIG. 1 cannot be changed from state '01' to '00' without first erasing the MLC. In other words, conventional techniques do not allow the threshold voltage of the MLC to be reliably decreased directly from the threshold voltage distribution labeled '01' to the threshold voltage distribution labeled '00'. Accordingly, where the threshold voltages are assigned to states '11', '10', '00', and '01' as shown in FIG. 1, the programming sequence where the LSB is programmed first and the MSB is programmed next must be used and not the programming sequence where the MSB is programmed first and the LSB is programmed next.

Unfortunately, the above ordering constraint on the programming sequence can have a negative impact on the overall performance of a flash memory system, since there may be cases where it is advantageous to program the MSB first and then program the LSB. For example, the ordering constraint prohibits an application from programming only the MSB and then later programming the LSB. In other words, the constraint prohibits true random access to MLCs.

SUMMARY OF THE INVENTION

Recognizing the above drawbacks of conventional MLC devices, embodiments of the present invention provide various program methods that allow the bits of selected multi-level memory cells to be programmed in an arbitrary order.

According to one embodiment of the invention, a method of programming a flash memory device including multi-level memory cells comprises determining whether to program an upper bit or a lower bit of a selected memory cell, detecting a current logic state of two bits of data stored in the selected memory cell, and determining a target logic state for the upper or lower bit. The method further comprises generating a program voltage and a verify voltage for programming the upper or lower bit to the target logic state, and applying the program voltage and the verify voltage to a word line connected to the selected memory cell.

According to another embodiment of the invention, a method of programming a NOR flash memory device is provided. The NOR flash memory device includes a selected memory cell capable of storing logic states '11', '10', '01', and '00', wherein the logic states '11', '10', '01', and '00' correspond to increasing levels of a threshold voltage of the selected memory cell. The method comprises determining whether to program an upper bit or a lower bit of the selected memory cell, detecting a current logic state of the upper and lower bits, and programming the selected memory cell from logic state '10' to logic state '00' if the current logic state is '10' and the upper bit is to be programmed, and programming the selected memory cell from logic state '01' to logic state '00' if the current logic state is '01' and the lower bit is to be programmed. respective upper and lower bits.

According to still another embodiment of the invention, a multi-level cell flash memory device comprises a voltage generator adapted to generate a program voltage for programming a selected memory cell of the flash memory device in response to a state selection signal and apply the program voltage to the selected memory cell. The multi-level cell flash memory device further comprises a sense amplifier adapted to sense a current logic state of the selected memory cell through a bit line connected thereto in response to a sense enable signal, a write driver adapted to activate the bit line in response to a write enable signal during a program operation of the selected memory cell, and a program controller adapted to generate the sense enable signal in response to a program address, and generate the state selection signal based on the current logic state of the memory cell. The selected memory cell can be programmed by first programming an upper bit and then programming a lower bit, or by first programming the lower bit and then programming the upper bit.

BRIEF DESCRIPTION OF THE DRAWINGS

The invention is described below in relation to several embodiments illustrated in the accompanying drawings. Throughout the drawings like reference numbers indicate like exemplary elements, components, or steps. In the drawings.

DESCRIPTION OF EXEMPLARY EMBODIMENTS

Exemplary embodiments of the invention are described below with reference to the corresponding drawings. These embodiments are presented as teaching examples, while the actual scope of the invention is defined by the claims that follow.

Figure 3:
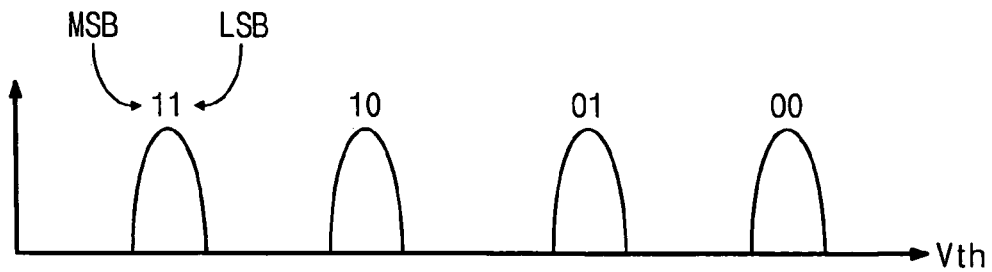
FIG. 3 is a drawing illustrating a threshold voltage distribution and corresponding state assignments for a multi-level flash memory cell according to an embodiment of the present invention.

FIG. 3 is a graph illustrating a threshold voltage distribution and corresponding logic states for a multi-level flash memory cell (MLC) according to one embodiment of the present invention. Referring to FIG. 3, the threshold voltage distribution corresponds to logic states '11', '10', '01', and '00' of the MLC, where the lowest threshold voltage corresponds to state '11', the next lowest threshold voltage to state '10', the next lowest threshold voltage to state '01', and the highest threshold voltage to state '00'. The states of the MLC are arranged so that changing either the most significant bit (MSB) or the least significant bit (LSB) from a '1' to a '0' corresponds to increasing the threshold voltage of the MLC. As a result, the MLC can be programmed by either programming the LSB first and then programming the MSB, or programming the MSB first and then programming the LSB.

Figure 4A:
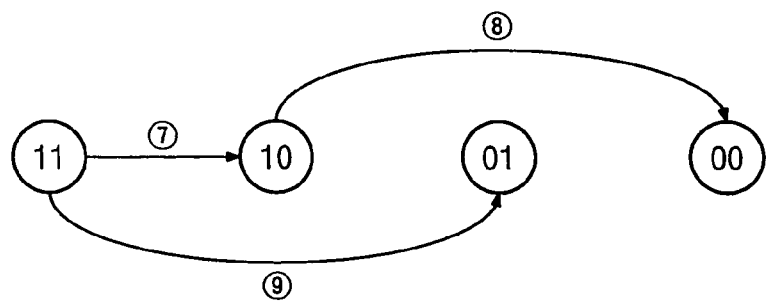
FIG. 4A is a state transition diagram for a program operation of a multi-level flash memory cell having the threshold distribution and corresponding state assignments shown in FIG. 3, wherein a LSB is programmed before a MSB.

FIG. 4A is a state transition diagram illustrating transitions taken in a program operation of a MLC having the threshold voltage distribution and state assignments shown in FIG. 3. In the program operation illustrated in FIG. 4A, the LSB of the MLC is programmed first, and then the MSB is programmed. Referring to FIG. 4A, the MLC transitions from state '11' to state '10' through a path labeled ⑦ to program the LSB. The MLC transitions from state '11' to '01' along a path labeled ⑨ or from state '10' to state '00' along a path labeled ⑧ to program the MSB.

Figure 4B:
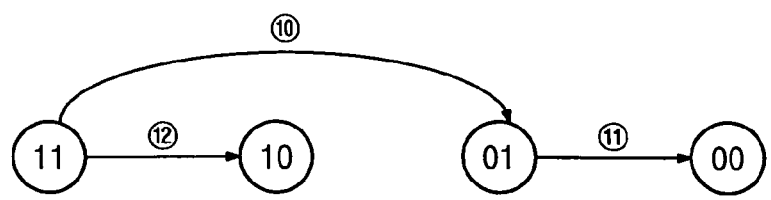
FIG. 4B is a state transition diagram for a program operation of a multi-level flash memory cell having the threshold distribution and corresponding state assignments shown in FIG. 3, wherein a LSB is programmed before a MSB.

FIG. 4B is a state transition diagram illustrating transitions taken in a program operation of a MLC having the threshold voltage distribution and state assignments shown in FIG. 3. In the program operation illustrated in FIG. 4B, the MSB of the MLC is programmed first, and then the LSB is programmed. Referring to FIG. 4B, the MLC transitions from state '11' to state '01' through a path labeled ⑩ to program the LSB. The MLC transitions from state '01' to '00' through a path ⑪ to program the LSB through, or, to program state '10', the MLC simply transitions from state '11' to '10' in one step.

Figure 1:
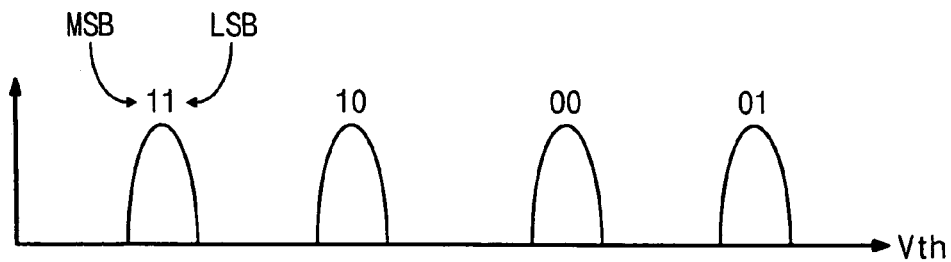
FIG. 1 is a drawing illustrating a threshold voltage distribution and corresponding state assignments for a conventional multi-level cell.
Figure 2A:
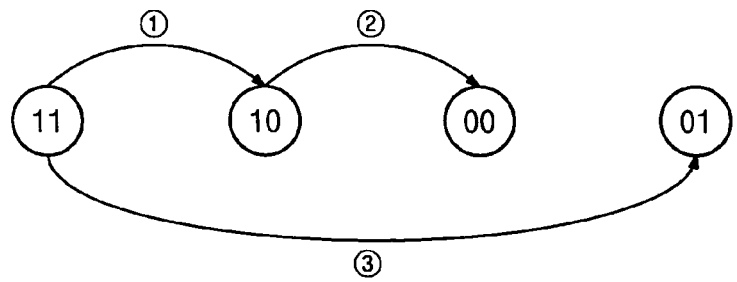
FIG. 2A is a state transition diagram for a program operation of a multi-level flash memory cell having the threshold distribution and corresponding state assignments shown in FIG. 1, wherein a least significant bit (LSB) is programmed before a most significant bit (MSB)
Figure 2B:
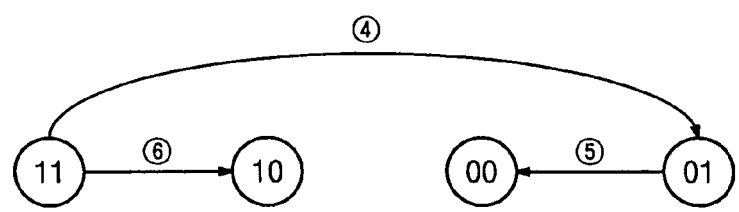
FIG. 2B is a state transition diagram for a program operation of a multi-level flash memory cell having the threshold distribution and corresponding state assignments shown in FIG. 1, wherein a MSB is programmed before a LSB.

As illustrated by FIGS. 4A and 4B, in a MLC having a threshold voltage distribution and corresponding state assignments such as those illustrated in FIG. 4 a program operation can be carried out by either programming the LSB first, and then the MSB, or programming the MSB first and then the LSB. In other words, the problem illustrated by FIGS. 2A and 2B does not occur when the states are arranged as shown in FIG. 3.

Figure 5:
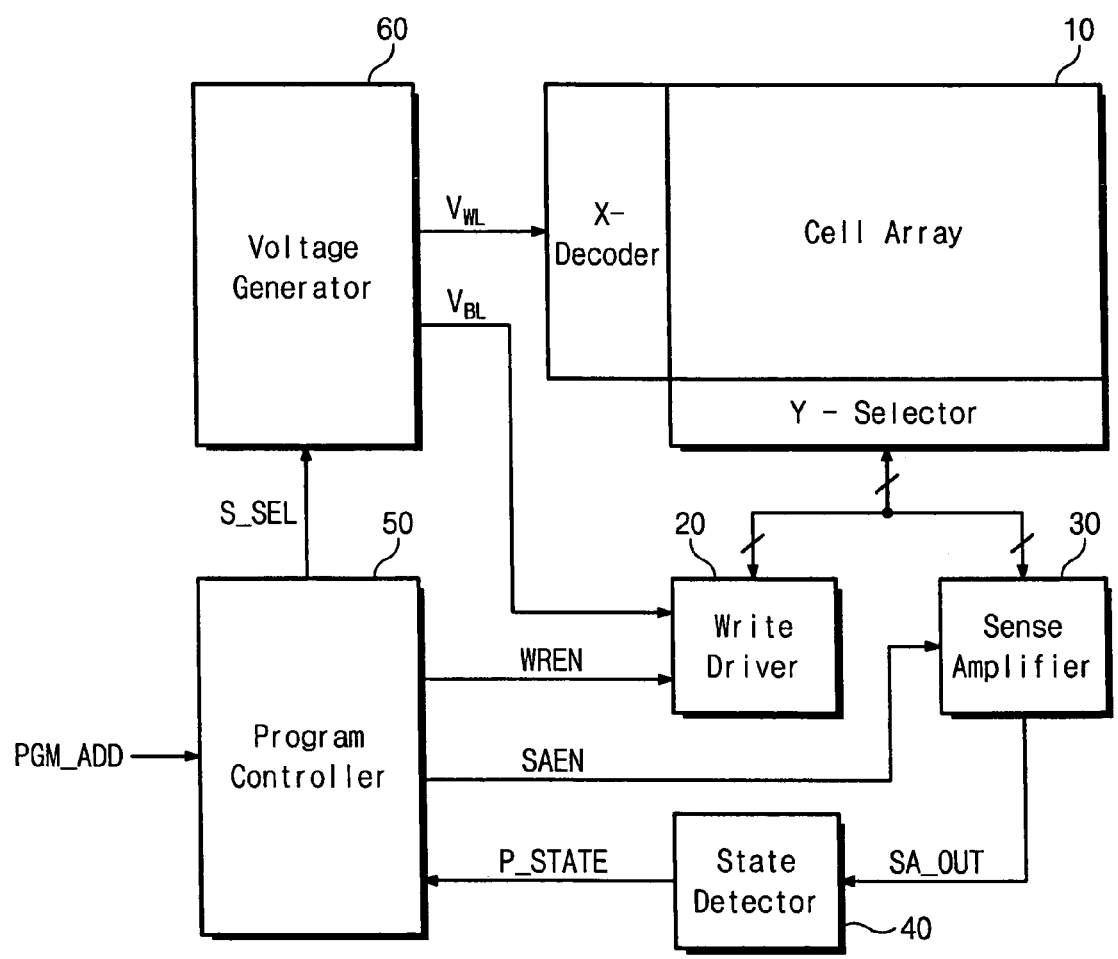
FIG. 5 is a block diagram illustrating a circuit for performing a program operation according to an embodiment of the present invention; and, FIG. 6 is a flowchart illustrating a method of performing a program operation in a multi-level flash memory cell according to an embodiment of the present invention.

FIG. 5 is a block diagram illustrating a flash memory device capable of programming a MLC according to the state transition diagram illustrated in FIG. 4. Referring to FIG. 5, the flash memory device comprises a memory cell array 10 having an X-decoder and a Y-selector, a write driver 20, a sense amplifier 30, a state detector 40, a program controller 50, and a voltage generator 60.

Write driver 20 drives selected bit lines with a bit line voltage $V_{BL}$ from voltage generator 60 to program selected MLCs in program operations of memory cell array 10. Sense amplifier 30 senses the logic state of selected MLCs in read and verify operations. State detector 40 receives and stores the logic state of the selected MLC from sense amplifier 30 based on a signal SA_OUT. Program controller 50 controls the overall program procedure by sensing the state of the cell in the program operation according to a signal P_STATE from state detector 40. Voltage generator 60 generates a program voltage based on a control signal S_SEL output by program controller 50.

Memory cell array 10 preferably includes the NOR type multi-level flash memory cells and X-decoder and Y-selector for selecting the cells. Preferably, each memory cell is capable of storing two bits of data, and logic states are assigned to the respective threshold voltages of each cell such that ascending threshold voltages correspond to logic states in the following order: '11', '10', '01', and '00', as illustrated in FIG. 3.

Write driver 20 activates a bit line of a selected memory cell when a program pulse $V_{pgm}$ is applied to a word line of the memory cell as a voltage $V_{WL}$. In a program operation, write driver 20 transfers bit line voltage $V_{BL}$ from voltage generator 60 to the activated bit line in response to a write enable signal WREN input from program controller 50. Program pulse $V_{pgm}$ is transferred to the word line, and a drain of the selected memory cell is biased at bit line voltage $V_{BL}$, which is preferably 5 V, so that injection of hot electrons occurs effectively.

Sense amplifier 30 is connected in parallel to write driver 20 and bit lines of the memory cells in memory cell array 10, and senses the logic state of selected memory cells in read and verify operations. A read voltage $V_{read}$ is applied to a word line connected to a selected cell in a read operation as word line voltage $V_{WL}$, and sense amplifier 30 senses the logic state of data stored in the selected cell according to the amount of current flowing through the selected cell. In order to sense 2-bit data, sense amplifier 30 typically performs serial sensing or parallel sensing. Sense amplifier 30 then outputs output signal SA_OUT with a logic level that depends on whether current flows through the selected cell in a read operation.

State detector 40 receives output signal SA_OUT to determine the logic state of the selected cell. State detector 40 is used to facilitate the programming of a selected cell from an initial state to a target state through an intermediate state, for example, as illustrated by the program sequence shown in FIG. 3.

Program controller 50 controls the programming of the MSB or the LSB of the selected memory cell in response to a program address signal PGM_ADD input from an external source. Program controller 50 receives the signal P_STATE, which indicates the value of one data bit in a currently selected cell, and outputs control signal S_SEL, which is a state select signal used by voltage generator 60 to generate a program voltage for programming the currently selected cell into a target state.

To sense the logic state of the currently selected cell, program controller 50 outputs a sense enable signal SAEN to activate a sensing operation of sense amplifier 30. In response to sense enable signal SAEN, sense amplifier 30 performs parallel or serial sensing of the data in the currently selected memory cell.

To briefly summarize the operation of program controller 50, program controller 50 senses the logic state of one bit of a selected memory cell base on signal P_STATE. Program controller 50 then determines a target state for the selected memory cell based on program address PGM_ADD. Program controller 50 then outputs state select signal S_SEL to voltage generator 60 so that voltage generator 60 generates appropriate word line voltages for programming the selected memory cell to the target state.

Voltage generator 60 generates the voltages $V_{WL}$ and $V_{BL}$ used in the program and verify operations, and applies the voltages $V_{WL}$ and $V_{BL}$ to the word line of the memory cell array 10 and the write driver 20, respectively. Voltage $V_{WL}$, which is applied to the word line, has program voltage $V_{pgm}$ during program operations and a verify voltage $V_{veri}$ during a verify operation. Preferably, program voltage $V_{pgm}$ is applied to program the memory cells in memory cell array 10 using incremental step pulse programming (ISSP) to shift the threshold voltage of the memory cells to verify voltage $V_{veri}$ or higher.

In general, ISSP is an iterative program method that uses a repeating loop to increase the threshold voltage of a selected memory cell by increasing the voltage level of program voltage $V_{pgm}$ in a stepwise fashion. After program voltage $V_{pgm}$ is applied to a selected memory cell in ISSP, verify voltage $V_{veri}$ is applied to the selected memory cell to verify whether the cell was properly programmed. Voltage generator 60 generates program voltage $V_{pgm}$ and verify voltage $V_{veri}$ for every state '10', '01', and '00' in response to state select signal S_SEL input from program controller 50. Program voltage $V_{pgm}$ shifts the threshold voltage of the selected cell toward a desired level corresponding to a target state, and verify voltage $V_{veri}$ verifies whether or not the threshold voltage of the memory cell has been elevated to the desired level.

The start value of program voltage $V_{PGM}$ in the above described ISPP program operation of a selected cell depends on the current logic state of the selected cell. For example, the program operation uses different start values of program voltage $V_{PGM}$ when the selected cell has current states of '11', '10', and '01'. In addition, voltage generator 60 also generates bit line voltage $V_{BL}$ to be applied to a bit line connected to selected memory cell during the program operation through write driver 20.

Figure 6:
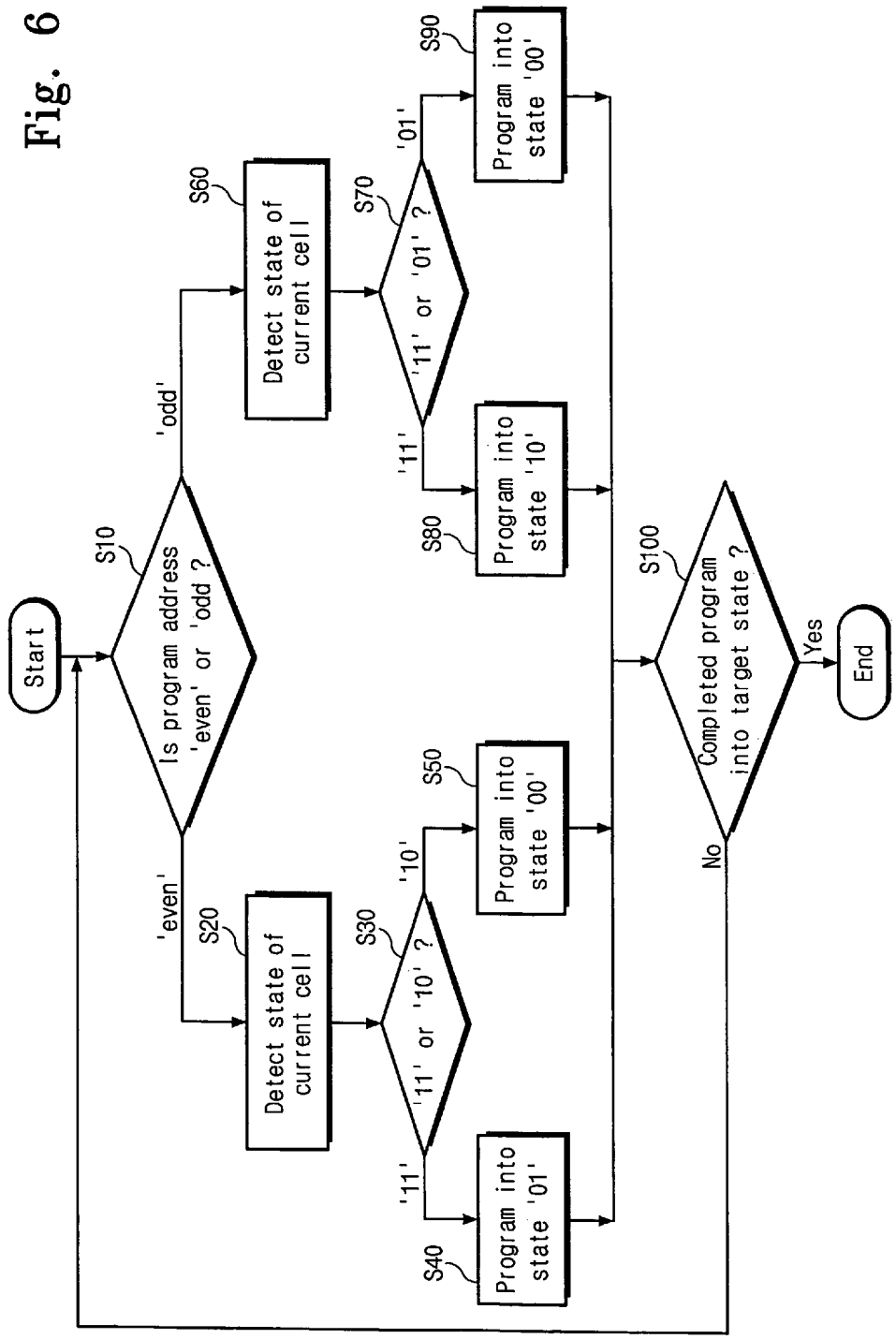

FIG. 6 is a flowchart illustrating a method of programming a MLC device such as the one illustrated in FIG. 5. In the description that follows, exemplary method steps are denoted by parentheses (XXX) to distinguish them from system features such as those illustrated in FIG. 5.

Referring to FIG. 6, the method comprises first determining whether to program a MSB or a LSB of a selected cell according to program address PGM_ADD, which is typically set by a user of the MLC device (S10). If program address PGM_ADD is 'even', the MSB is programmed first, and if program address PGM_ADD is 'odd', the LSB is programmed first.

Next, the logic state of the selected cell is detected (S20 and S60). This can be accomplished, for example, by applying sense enable signal SAEN to sense amplifier 30 under the control of program controller 50. If the bit of the cell to be programmed is the MSB, it means that the MSB is in the erased state. On the other hand, if the MSB is to be programmed, the current value of the LSB may be '0' or '1', and therefore the current threshold voltage of the selected cell is checked to determine the logic state of the LSB (S20). Similarly, if the bit to be programmed is the LSB, it means that the LSB is in the erased state and the value of the MSB is unknown. Accordingly, the state of the LSB will be checked in a step (S60).

As an illustration of how the logic state of the MSB or LSB is detected, state detector 40 in FIG. 5 can be used to communicate the current value of the LSB to program controller 50 using the signal P_STATE. Based on the value of the signal P_STATE, program controller 50 can whether the state of the selected cell is '11' or '10' (S30) or whether the state of the selected cell is '11' or '01' (S70).

If the current state of the selected cell is '11', then programming the MSB will change the selected memory cell to the state '01' (S40) and programming the LSB will change the selected memory cell to the state '10' (S80). On the other hand, if the state of the selected memory cell is '10', programming the MSB will change the logic state of the selected memory cell to state '00' (S50) and if the state of the selected memory cell is '01', programming the LSB will also change the logic state of the selected memory cell to '00' (S90).

When programming the selected memory cell from logic state '11' to logic state '00' by programming the MSB first, a state transition path such as the one illustrated in FIG. 4B should be followed. In particular, the transitions corresponding to paths ⑩ and ⑪ should be taken in a sequence. Similarly when programming the selected memory cell from logic state '11' to logic state '00' by programming the LSB first, a state transition path such as the one illustrated in FIG. 4A should be followed. In particular, the transitions corresponding to paths ⑦ and ⑧ should be taken in a sequence. Where successive program operations are required to program both the MSB and the LSB, the program operation for programming the last bit can be executed directly after verifying that the first bit is completely programmed. In other words, it is not always necessary in this case to re-check whether the cell is in state '11' or '01' when the LSB is programmed last, or to re-check whether the cell is in state '11' or '10' when the MSB is programmed last.

Once programming is completed in any of steps (S40), (S50), (S80), or (S90), a step (S100) is performed to determine whether programming of the selected cell has been completed. If yes, the method terminates. Otherwise, the method returns to step (S10).

According to various embodiments of the present invention as described above, a multi-level cell where two or more bits are stored can be programmed by either programming a LSB before programming a MSB, or by programming a MSB before programming a LSB. Embodiments of the invention also provide various methods for programming such multi-level cells. Multi-level cells where either the MSB or the LSB can be programmed first tend to be more adaptable to different system requirements than conventional multi-level cells without this property. In addition, they allow true random bit access in program operations.

The foregoing preferred embodiments are teaching examples. Those of ordinary skill in the art will understand that various changes in form and details may be made to the exemplary embodiments without departing from the scope of the present invention as defined by the following claims.

What is claimed:

1. A method of programming a flash memory device including multi-level memory cells, the method comprising:
   determining whether to program an upper bit or a lower bit of a selected memory cell;
   detecting a current logic state of two bits of data stored in the selected memory cell;
   determining a target logic state for the upper or lower bit;
   generating a program voltage and a verify voltage for programming the upper or lower bit to the target logic state; and,
   applying the program voltage and the verify voltage to a word line connected to the selected memory cell.

2. The method of claim 1, further comprising:
   successively programming the respective upper and lower bits.

3. The method of claim 1, wherein the flash memory device is a NOR type flash memory device.

4. The method of claim 1, wherein the selected memory cell has a variable threshold voltage with levels assigned to corresponding logic states such that whenever either the upper bit or the lower bit is programmed, the threshold voltage increases.

5. The method of claim 1, wherein determining whether to program the upper or lower bit comprises decoding a program address.

6. The method of claim 5, further comprising, programming the upper bit or the lower bit based on whether the program address is even or odd.

7. A method of programming a NOR flash memory device including a selected memory cell capable of storing logic states '11', '10', '01', and '00', wherein the logic states '11', '10', '01', and '00' correspond to increasing levels of a threshold voltage of the selected memory cell, the method comprising:
   determining whether to program an upper bit or a lower bit of the selected memory cell;
   detecting a current logic state of the upper and lower bits; and,
   programming the selected memory cell from logic state '10' to logic state '00' if the current logic state is '10' and the upper bit is to be programmed, and programming the selected memory cell from logic state '01' to logic state '00' if the current logic state is '01' and the lower bit is to be programmed.

8. The method of claim 7, further comprising:
   successively programming the respective upper and lower bits.

9. The method of claim 7, further comprising:
   generating a program voltage and a verify voltage for programming selected memory cell from the current logic state to a target logic state.

10. The method of claim 9, wherein the program voltage has a start voltage that is determined by the current logic state.

11. A multi-level cell flash memory device, comprising:
    a voltage generator adapted to generate a program voltage for programming a selected memory cell of the flash memory device in response to a state selection signal and apply the program voltage to the selected memory cell;
    a sense amplifier adapted to sense a current logic state of the selected memory cell through a bit line connected thereto in response to a sense enable signal;
    a write driver adapted to activate the bit line in response to a write enable signal during a program operation of the selected memory cell; and,
    a program controller adapted to generate the sense enable signal in response to a program address, and generate the state selection signal based on the current logic state of the memory cell;
    wherein the selected memory cell can be programmed by first programming an upper bit and then programming a lower bit, or by first programming the lower bit and then programming the upper bit.

12. The flash memory device of claim 11, wherein the selected memory cell is capable of storing logic states '11', '10', '01', and '00', wherein the logic states '11', '10', '01', and '00' correspond to increasing levels of a threshold voltage of the selected memory cell.

13. The flash memory device of claim 12, wherein the state selection signal is used to program the selected memory cell from the current logic state to a target logic state.

14. The flash memory device of claim 13, wherein voltages for programming the selected memory cell into the target state include a program voltage and a verify voltage applied to a word line of the selected memory cell, and a bit line voltage applied to the write driver.

15. The flash memory device of claim 14, wherein the program voltage has a start voltage that is determined by the current logic state.

16. The flash memory device of claim 12, wherein the upper or lower bit of the selected memory cell is programmed first depending on a value of the program address.

17. The flash memory device of claim 16, wherein the upper or lower bit is programmed first based on whether the program address is even or odd.

18. The flash memory device of claim 11, wherein the memory cell is a NOR type flash memory cell.

* * * * *